(12) United States Patent
Igarashi et al.

(10) Patent No.: US 6,779,167 B2
(45) Date of Patent: Aug. 17, 2004

(54) AUTOMATED WIRING PATTERN LAYOUT METHOD

(75) Inventors: Mutsunori Igarashi, Kanagawa-ken (JP); Masaaki Yamada, Kanagawa-ken (JP); Koji Hashimoto, Kanagawa-ken (JP); Makoto Takashima, Kanagawa-ken (JP); Atsuhiko Ikeuchi, Kanagawa-ken (JP)

(73) Assignee: Kabushiki Kaisha Toshiba (JP)

( * ) Notice: Subject to any disclaimer, the term of this patent is extended or adjusted under 35 U.S.C. 154(b) by 129 days.

(21) Appl. No.: 10/133,953

(22) Filed: Apr. 26, 2002

(65) Prior Publication Data

US 2002/0162079 A1 Oct. 31, 2002

(30) Foreign Application Priority Data

Apr. 27, 2001 (JP) .................................... P2001-133168

(51) Int. Cl.[7] ............................................. G06F 17/50
(52) U.S. Cl. ........................................... 716/13; 716/10
(58) Field of Search ............................... 716/1–2, 8–15

(56) References Cited

U.S. PATENT DOCUMENTS 5,822,214 A * 10/1998 Rostoker et al. ............... 716/10
6,081,036 A    6/2000 Hirano et al.
6,546,540 B1 * 4/2003 Igarashi et al. ................ 716/13
6,640,332 B2 * 10/2003 Mitome et al. ................ 716/15
2003/0079194 A1 * 4/2003 Igarashi et al. ................ 716/8

FOREIGN PATENT DOCUMENTS

| JP | 11-220020 | 8/1999 |
| JP | 2000-082743 | 3/2000 |
| JP | 2001-142931 | 5/2001 |

* cited by examiner

*Primary Examiner*—Leigh M. Garbowski
(74) *Attorney, Agent, or Firm*—Gray Cary Ware & Freidenrich LLP

(57) ABSTRACT

An automated wiring pattern layout method is provided. With this method, a first wiring pattern is generated with width W and extending in a first direction, and a second wiring pattern is generated with width W and extending in a direction perpendicular to the first wiring pattern in a manner such that the end thereof ends at the end portion of the first wiring pattern. Moreover, an overlapping region is generated by bending an end of either one of the first or the second wiring pattern at a right angle to produce an L-shaped extension and overlaying the first and the second wiring pattern, and a rectangular-shaped VIA pattern is generated at the overlapping region.

7 Claims, 15 Drawing Sheets

1501

1503

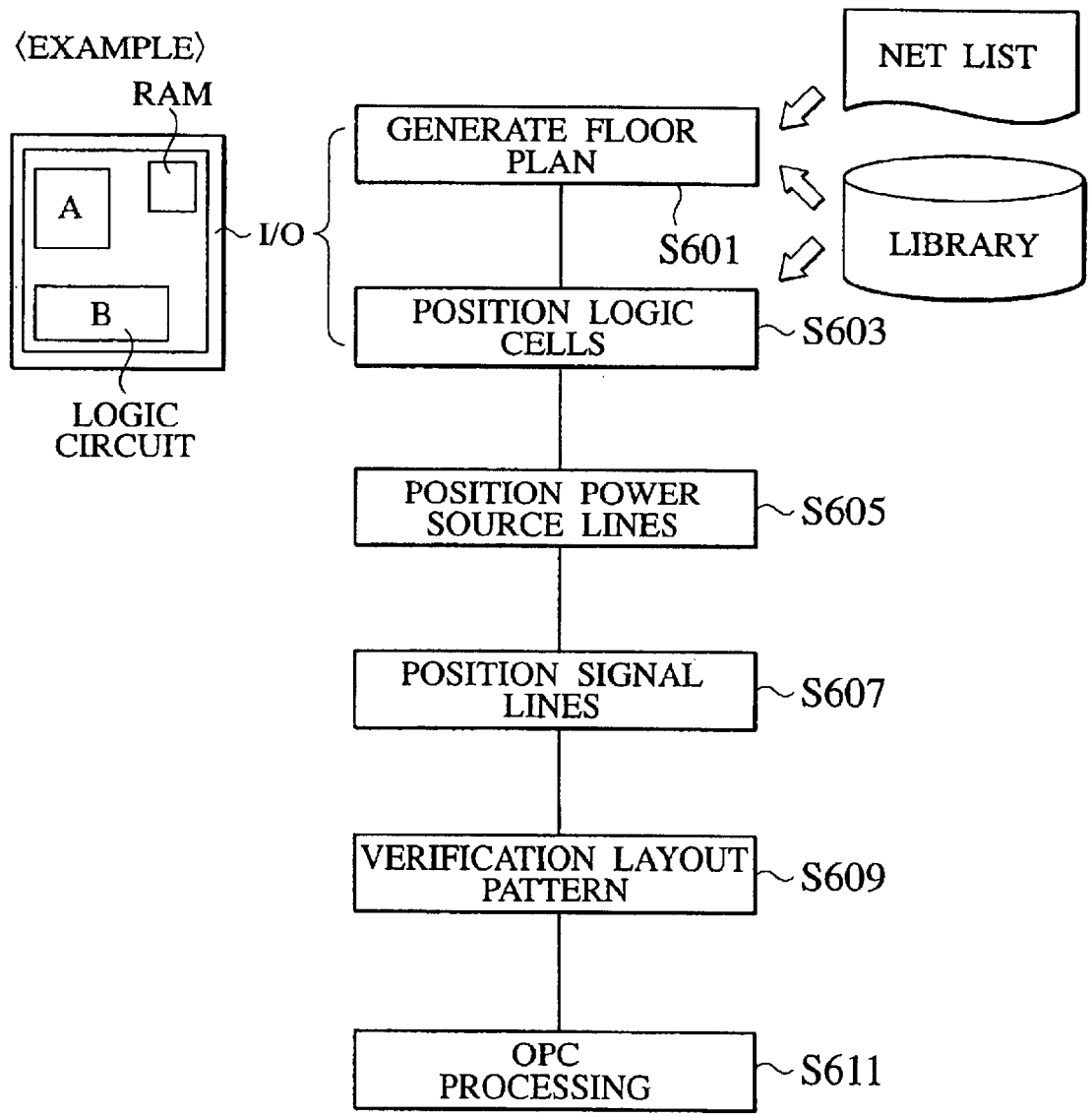

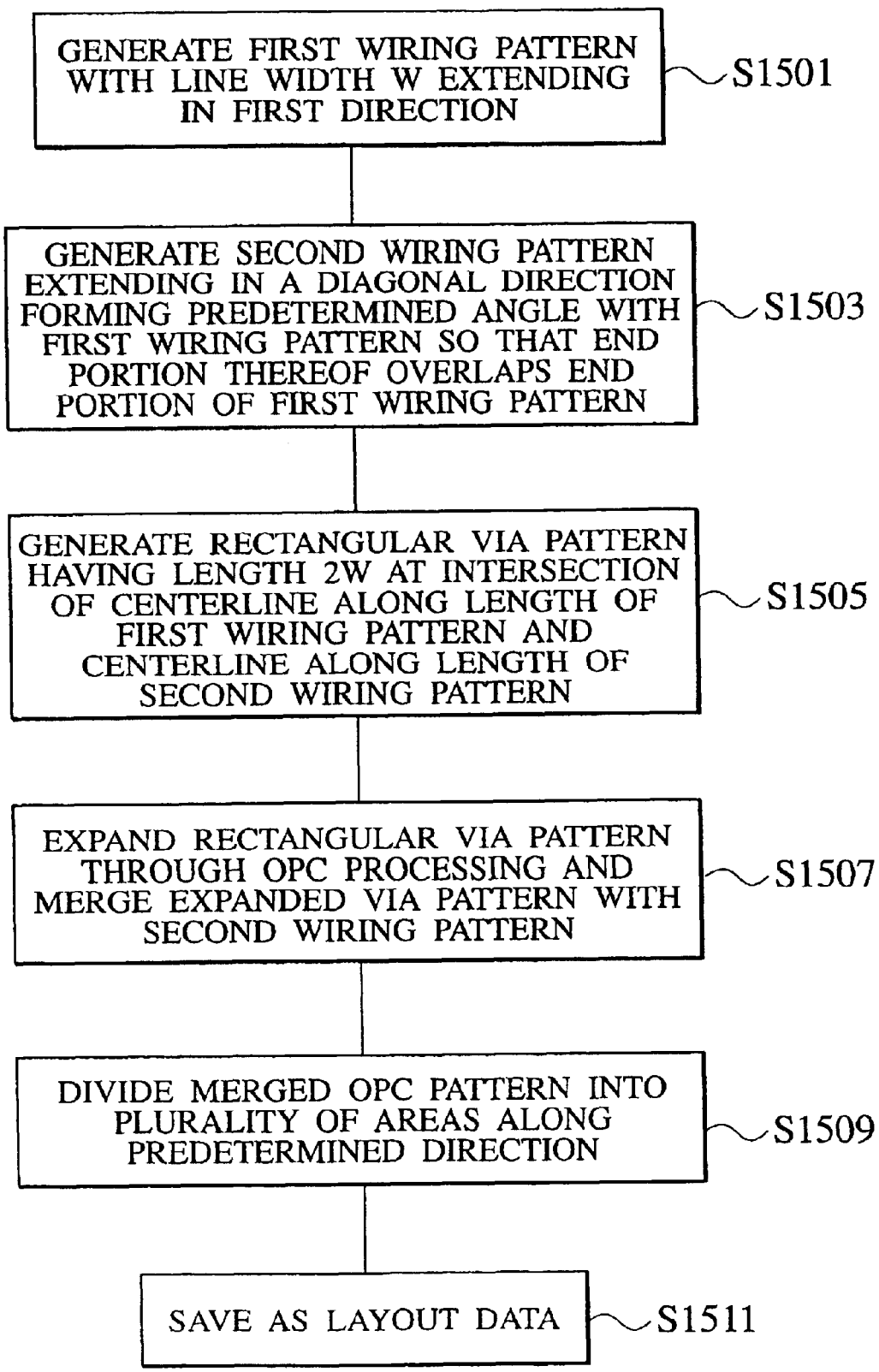

AUTOMATED WIRING PATTERN LAYOUT METHOD

CROSS REFERENCE TO RELATED APPLICATION

This application is based upon and claims the benefit of priority from the prior Japanese Patent Application No. 2001-133168 filed on Apr. 27, 2001, the entire contents of which are incorporated herein by reference.

BACKGROUND OF THE INVENTION

1. Field of the Invention

The present invention relates to an automated wiring pattern layout method using CAD; a semiconductor integrated circuit, which is manufactured through this automated layout method; and storage media recorded with an automated layout program.

2. Description of the Related Art

Accompanying the increased large scale of circuits through progress in LSI technologies, the amount of circuit layout design and the mask design process have become immense. Therein, layout design is being performed through computer aided design (CAD), which is a logical design method capable of making effective use of a computer.

Accompanying the miniaturization of circuits in recent years, besides wiring resistance, the resistance of a VIA contact connecting differing layers of wiring to each other is an important element which must be considered when deciding chip performance. The mask for VIA contacts has a rectangular-shaped contact plane pattern with an aspect ratio (ratio of long edge to short edge) of nearly 1, and is the most miniature pattern in the various wiring masks. In addition, it is the region having a relatively small lithography process margin, where that region determines the accuracy of the lithography process. As one method of guaranteeing accuracy of such a post-exposure transferred pattern of such a minute shape, there is a method which shortens the wavelength of the light source used in photolithography; however shortening of the wavelength of the exposure light cannot always keep pace with device miniaturization, which increases every year.

Therefore, it has become important to have VIA design, which secures as much via contact cross-sectional area as the accuracy of the lithography can guarantee, and which uses current exposure apparatuses to the furthest extent possible.

In addition, with miniaturization processes of late, in order to compensate for the finished dimensions around the post-exposure processing VIA, layout pattern data correction is performed by conducting optical corrective processing called optical proximity correction (OPC). More specifically, as shown in FIG. 1A, with a CAD-based layout pattern, a VIA contact pattern 1301 is set at the end portion where two wiring patterns M1 and M2 intersect; however, if exposure is actually performed using a mask produced based on this layout pattern, as shown in FIG. 1B, the VIA contact pattern 1303 transferred onto the wafer is reduced. This reduction phenomenon is especially prominent in cases where the process margin for the lithography determining the mask process accuracy is small; thus the pattern transferred upon the wafer is remarkably reduced in comparison with the designed data. As a result, not only does the VIA resistance increase deteriorating the circuit performance, but breakage occurs due to weakened electromigration resistance.

SUMMARY OF THE INVENTION

According to an aspect of the present invention a wiring pattern layout method includes generating a first pattern with width W extending in a first direction and generating a second wiring pattern with width W extending in a direction perpendicular to the first wiring pattern in a manner such that the end thereof ends at the end of the first wiring pattern. The method further includes generating an overlapping region by bending an end of either one of the first or the second wiring pattern at a right angle to produce an L-shaped extension and overlaying the first and the second wiring pattern, and generating a rectangular-shaped VIA pattern at the overlapping region.

According to the first aspect of the present invention, a semiconductor device includes a substrate, a first interlayer insulating layer on the substrate, a first metal wiring on the first interlayer insulating layer. The first metal wiring has a width of W, extends in a first direction, and has a first end portion. The semiconductor device further includes a second interlayer insulating layer, which covers the first metal layer and first interlayer insulating layer. The semiconductor device furthermore includes a second metal wiring on the second interlayer insulating layer, and a VIA contact. The second metal extends in a direction perpendicular to the first metal wiring, and has an L-shaped bent region with a length of at least 2 W but no greater than 5 W overlapping the first end portion of the first metal wiring end. The VIA contact passes through the second interlayer insulating layer and connects the first end portion of the first metal wiring and the L-shaped bent region of the second metal wiring.

According to the first aspect of the present invention, a computer readable recording medium is recorded with a program for causing an automated layout device to operate. This program causes the automated layout device to generate a first wiring pattern with width W extending in a first direction, generate a second wiring pattern with width W extending in a direction perpendicular to the first wiring pattern in a manner such that the end thereof ends at the end portion of the first wiring pattern. This program further causes it to generate an overlapping region by bending an end of either one of the first or the second wiring pattern at a right angle, extending to a length of at least 2 W but no greater than 5 W, and overlaying the first wiring pattern and the second wiring pattern, and generate at the overlapping region a rectangular-shaped VIA pattern having an aspect ratio of at least two but no greater than five.

According to a second aspect of the present invention, a wiring pattern optical correction method includes generating a first wiring pattern which extends in a first direction and generating a second wiring pattern. The second pattern extends diagonal to the first wiring pattern so that the end of the second wiring pattern overlaps the end of the first wiring pattern. The method further includes designating a parallelogram-shaped overlapping region, which has the intersection of a centerline along the length of the first wiring pattern and a centerline along the length of the second wiring pattern as a center point, at the end portion where the first wiring pattern and second wiring pattern overlap. The method furthermore includes generating an expansion region, obtained by expanding in the same direction the respective outsides of the two edges along the first wiring pattern and also the respective outsides of the two edges along the diagonal second wiring pattern of the parallelogram-shaped overlapping region, generating a merge pattern by merging the second wiring pattern and the expansion region, and dividing the merge pattern into a plurality of regions along the same direction.

According to the second aspect of the present invention, a wiring pattern layout method includes generating a first wiring pattern with a width W extending in a first direction, generating a second wiring pattern with a width wider than width W of the first wiring pattern extending in a direction diagonal to the first wiring pattern so that end of the second wiring pattern overlaps the end of the first wiring pattern. The method further includes generating along the first wiring pattern, at the intersection of a centerline along the length of the first wiring pattern and a centerline along the length of the second wiring pattern, a rectangular-shaped first VIA pattern having an aspect ratio of at least two so that the center point thereof matches the intersection.

According to a third aspect of the present invention, a wiring pattern optical correction method includes generating a first wiring pattern extending in a first direction, generating a second wiring pattern extending diagonal to the first wiring pattern so that the end of the second wiring pattern overlaps the end portion of the first wiring pattern. The method further includes designating at the end portion where the first wiring pattern and the second wiring pattern overlap a parallelogram-shaped overlapping region, which has the intersection of a centerline along the length of the first wiring pattern and a centerline along the length of the second wiring pattern as a center point. The method furthermore includes generating at the intersection as a center a rectangular-shaped expansion region by expanding the rectangular-shaped overlapping region, generating a merge pattern by merging the second wiring pattern and the rectangular-shaped expansion region, and dividing the merge pattern into a plurality of regions along a single direction.

According to the third aspect of the present invention, a semiconductor device includes a substrate, a first interlayer insulating layer on the substrate, a first metal wiring on the first interlayer insulating layer. The first metal has a width of W, extends in a first direction, and has a first end portion. The semiconductor device further includes a second interlayer insulating layer, which is positioned covering the first metal layer and the first interlayer insulating layer. The semiconductor device furthermore includes a second metal wiring on the second interlayer insulating layer and a VIA contact. The second metal wiring extends in a diagonal direction forming a predetermined angle with the first metal wiring, has a second end positioned above first end of the first metal wiring, and has a width wider than width W of the first metal wiring. The VIA contact passes through the second interlayer insulating layer and connects the first end portion of the first metal wiring and second end portion of the second metal wiring.

According to the third aspect of the present invention, a computer readable recording medium is recorded with a program for causing an automated layout device to operate. This program causes the automated layout device to, generate a first wiring pattern with width W extending in a first direction, generate a second wiring pattern extending in a direction diagonal to the first wiring pattern so that the end thereof ends at the end portion of the first wiring pattern, detect the intersection of a centerline along the length of the first wiring pattern and a centerline along the length of the second wiring pattern, and generate along the first wiring pattern with the extracted intersection as the center, a rectangular-shaped VIA pattern having an aspect ratio of at least two but no greater than five.

According to the third aspect of the present invention, a computer readable recording medium is recorded with a program for causing an optical correction device to operate.

The program causes the optical correction device to read out a wiring layout including a first wiring pattern, which extends in a first direction and is generated by an automated layout device, a second wiring pattern and a rectangular-shaped VIA pattern. The second wiring pattern extends in a direction diagonal to the first wiring pattern and has an overlapping region where the end thereof and the end portion of the first wiring pattern overlap. The rectangular-shaped VIA pattern is positioned at the overlapping region. Thereafter the program causes the optical correction device to generate an expanded region by expanding the rectangular-shaped VIA pattern a predetermined rate with the center point thereof as a reference, generate a merge pattern by merging the expanded region and the second wiring pattern, and divide the merge pattern into a plurality of regions along a single direction.

BRIEF DESCRIPTION OF THE DRAWINGS

FIG. 6 is a flowchart showing a processing procedure used when producing a mask pattern for a semiconductor integrated circuit;

FIG. 15 is a flowchart showing an automated layout method of a diagonal wiring and the procedure for the optical correction (OPC) processing there continuing, according to a third embodiment of the present invention.

DETAILED DESCRIPTION OF THE EMBODIMENTS

<Diagonal wirings>

Most recently the inventers have been studying the employment of diagonal wirings, which connect the shortest distance between two points in order to reduce wiring resistance (Japanese Patent Application Laid-open No. 2000-82743).

Figure 1A:
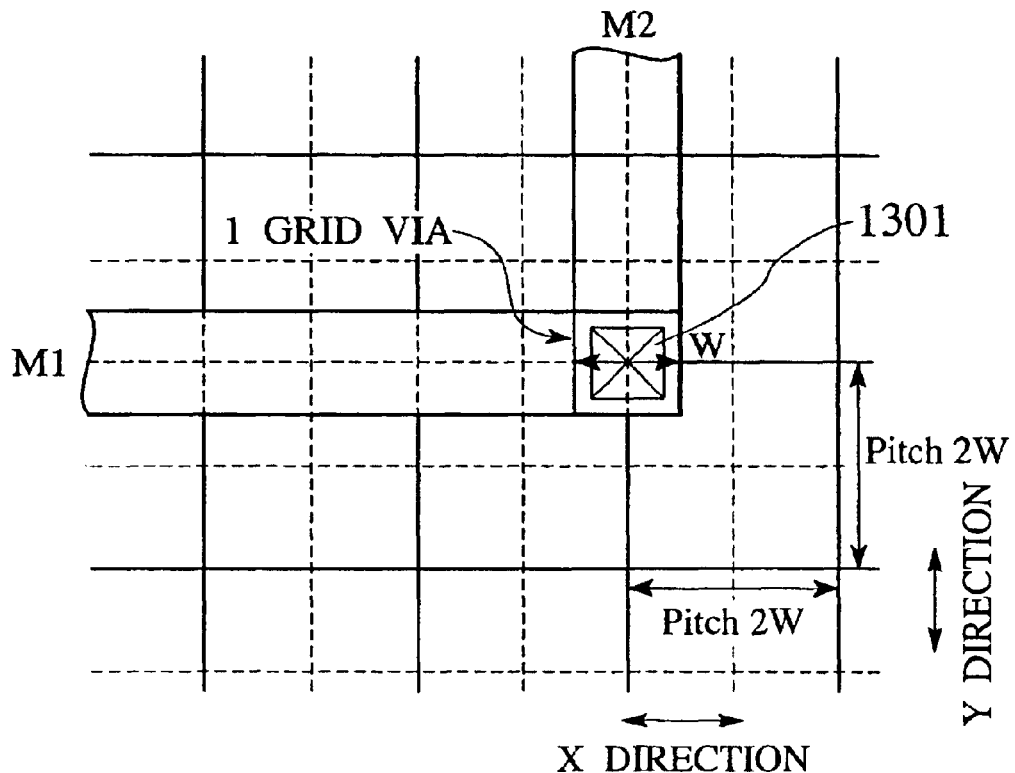
FIG. 1A and FIG. 1B are diagrams showing a conventional CAD-based layout design pattern having a rectangular wiring pattern and via contact pattern, and the pattern transferred upon a wafer.
Figure 1B:
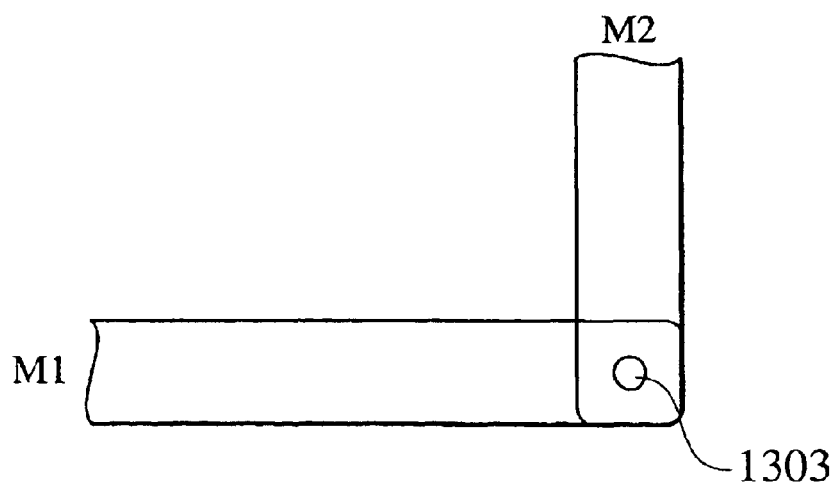
Figure 2A:
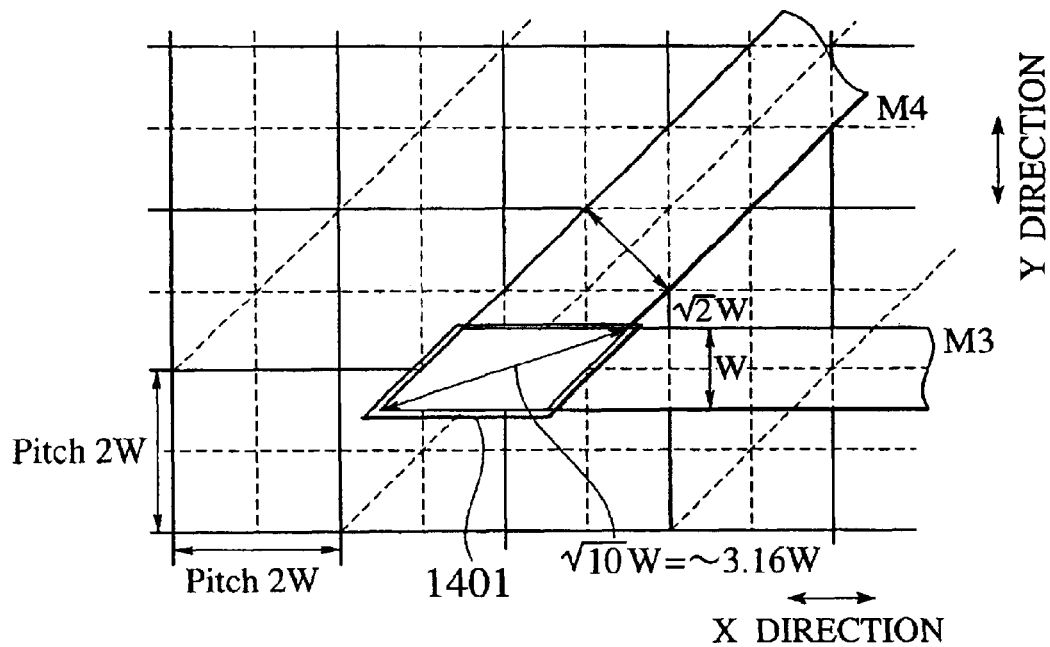
FIG. 2A and FIG. 2B are diagrams showing a CAD-based layout design pattern having a diagonal wiring pattern and a via contact pattern, and the pattern transferred upon a wafer.

In the "2. Description of the Related Art" described above, the case of rectangular wirings is described using FIG. 1A and FIG. 1B; however, a similar issue exists with diagonal wirings. As shown in FIG. 2A, in the case where a VIA is provided at the intersection of a diagonal wiring pattern M4 and an another wiring pattern M3, setting of parallelogram-shaped VIA contact pattern 1401 is proposed. However, in the case of a parallelogram-shaped via contact pattern, shortening of the pattern is severe, particularly in the acute angle portions, and as can be understood by comparing FIG. 2A and FIG. 2B, there is a large gap between the designed pattern and the VIA contact pattern 1403 actually obtained. For this reason, it is difficult to achieve the pattern area based on that designed and therefore the VIA contact resistance expected may be exceeded by far.

Figure 3A:
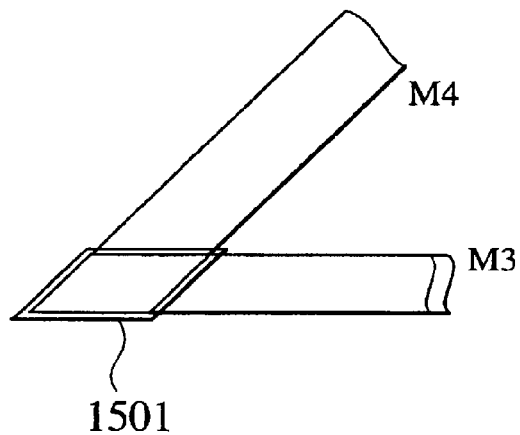
FIG. 3A to FIG. 3D are diagrams showing a procedure for OPC processing conducted on a diagonal wiring pattern.
Figure 3B:
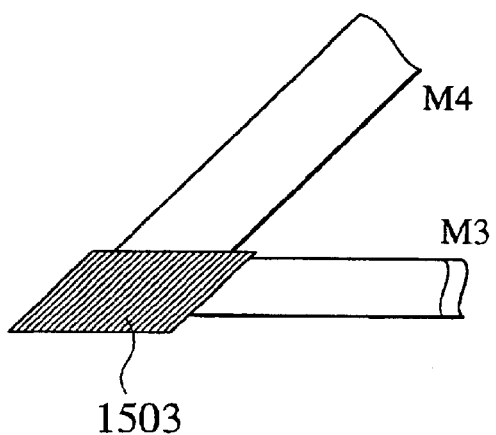
Figure 3C:
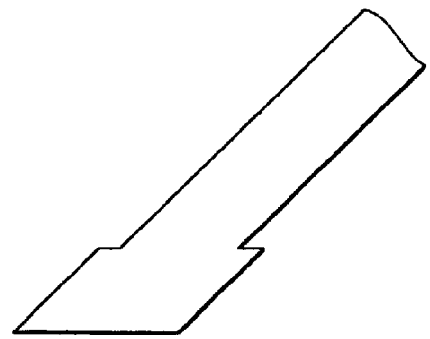
Figure 3D:
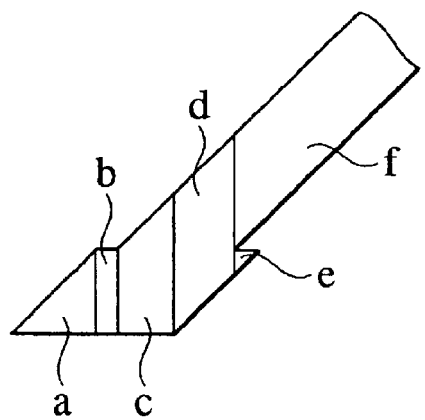

Conducting the above-described OPC processing on design layout data can be considered in order to prevent VIA contact shortening from occurring in the case where such diagonal wirings are employed. FIG. 3A to FIG. 3D show phases of OPC processing conducted on a diagonal wiring pattern. To begin with, as shown in FIG. 3A, data for wiring patterns M3 and M4 produced using CAD is read out. The parallelogram-shaped VIA pattern 1501 is set at the wiring intersection. Next, as shown in FIG. 3B, an OPC pattern 1503, which has the expanded shape of this VIA pattern 1501, is superimposed upon VIA pattern 1501. Next, as shown in FIG. 3C, the layout data of the diagonal wiring pattern M4 and the data for the OPC pattern are merged. Ultimately, as shown in FIG. 3D, the merged data is divided through mask data conversion processing into a plurality of primary regions a through f, which extend in the same direction.

With such a method, the number of patterns created by the dividing process is large and extremely minute patterns b and e are generated. As a result, the amount of data is remarkably large and conversion from layout data to mask data takes time. When this data is further used to perform exposure, there is a danger that minute patterns (e.g. areas b and e) may not be transferred. While such transferring is not impossible if shorter wavelength exposure beams are used (e.g. x-ray beams), a great deal of time is required for drawing patterns and, in addition, costs are high.

<First Embodiment>

Figure 4:
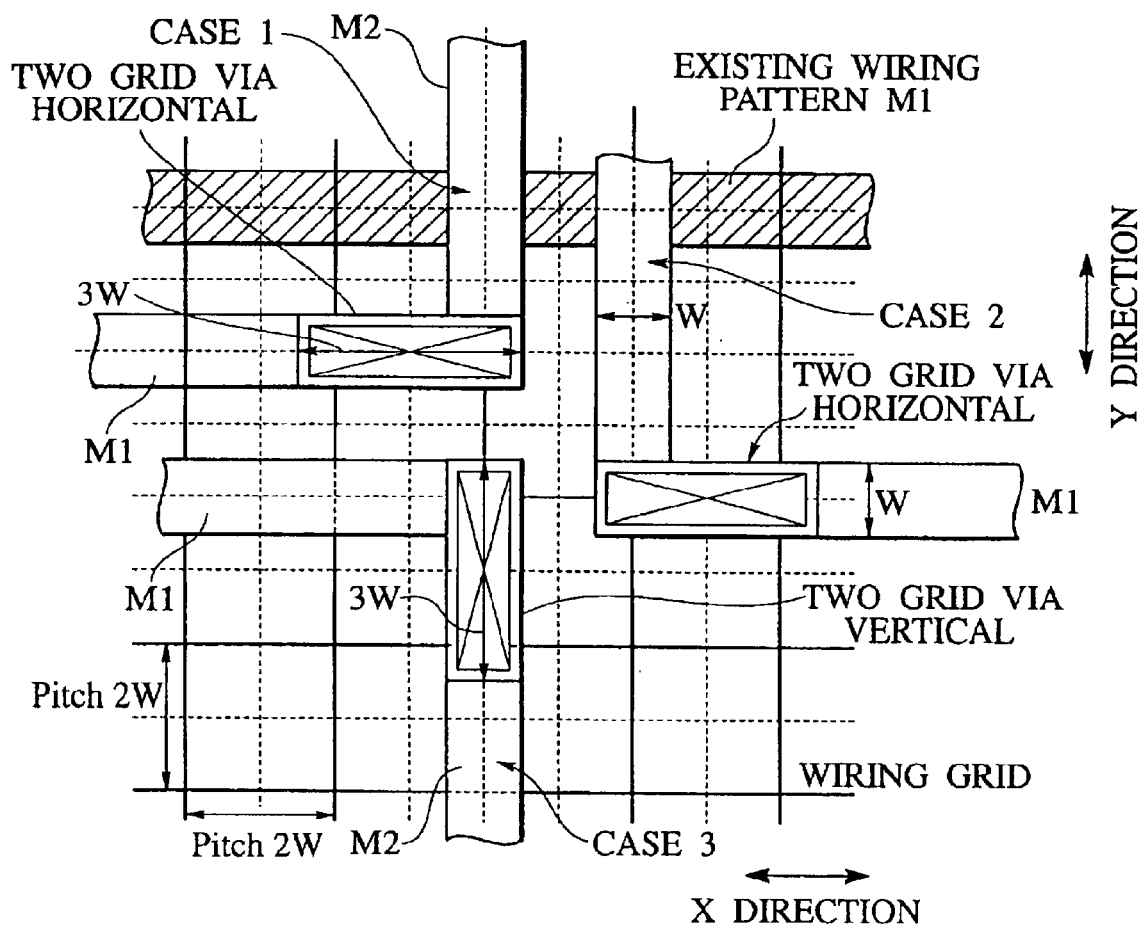
FIG. 4 is a planar view showing wiring layout of a rectangular coordinate system created through an automated layout method according to a first embodiment of the present invention and rectangular-shaped VIAs used therewith.

FIG. 4 is a planar view showing wiring layout produced with CAD, through an automated layout method according to a first embodiment of the present invention. With this embodiment, three rectangular wiring patterns of Case 1 to Case 3 are produced, in addition to the existing wiring pattern M1, which has already been formed upon the CAD grid. Both a first wiring pattern M1 and a second wiring pattern M2, in a direction perpendicular there to, have wiring width W. The first wiring pattern M1 and the second wiring pattern M2 are formed in the lowest layer where elements such as transistors are formed. The lowest layer is, of the plurality of wiring layers, a layer where design rules are extremely strict.

It is noted that the grid of FIG. 4 is used for convenience of description of the wiring method, and is not always required. It is not necessary to display the grid itself on the CAD screen as long as it is a grid size that fulfills intervals between wirings that correspond to the width of the wirings laid down (or the design rules).

A main aspect of the first embodiment is the fact that the VIA pattern for a VIA contact connecting a first wiring pattern M1 and a second wiring pattern M2 is a rectangular-shaped VIA with an aspect ratio (ratio of long edge to short edge) of approximately 3. In cases 1 and 2, rectangular-shaped VIAs having a length in the horizontal direction of 3 W are set, and in case 3, a rectangular-shaped VIA having a length in the vertical direction of 3 W is set. The direction of the rectangular-shape (the x direction or y direction) is set in accordance with whether there is an existing wiring in the vicinity. This is described in further detail later.

In FIG. 4, a grid having a pitch of 2 W is formed upon a CAD screen. Here, a 2 grid VIA means occupying two grids. To begin with, in order to generate a wiring pattern such as this diagram upon the screen, a first wiring pattern M1 having a wiring width W is generated extending along the horizontal direction (x direction). Next, A second wiring pattern M2 having a wiring width W and extending in a direction perpendicular to this first wiring pattern M1 is generated in a manner such that the end portion thereof ends in the end portion of the first wiring pattern M1. The end portion of either one of the first wiring pattern M1 or the second wiring pattern M2 is bent and extended into a L-shape (with Case 1, the second wiring pattern M2 is extended), and a rectangular-shaped VIA pattern having an aspect ratio of approximately 3 is generated in the overlapping region where the first wiring pattern M1 and the second wiring M2 overlap.

Figure 5A:
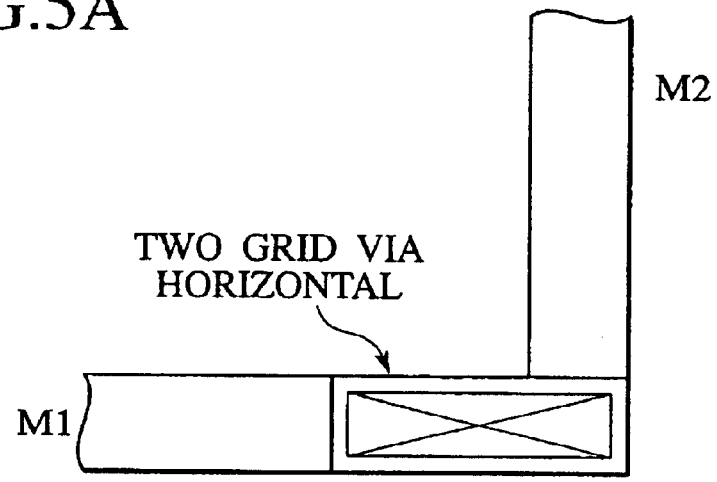
FIGS. 5A to 5C are diagrams showing a layout pattern of rectangular wirings designed with the method of FIG. 4, planer shape of the pattern in each layer and the pattern transferred upon the wafer.
Figure 5B:
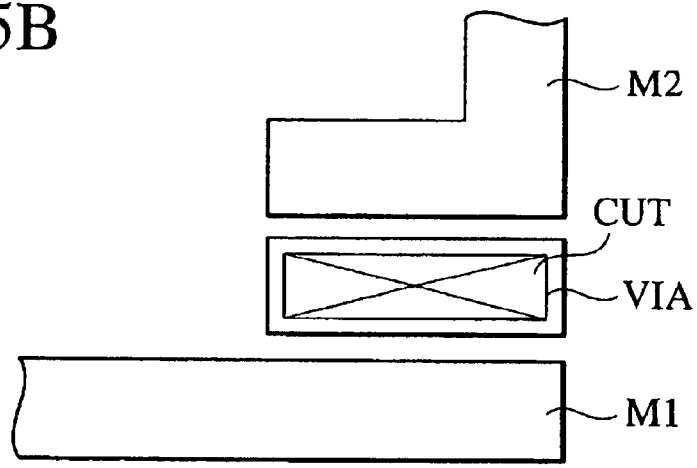
Figure 5C:
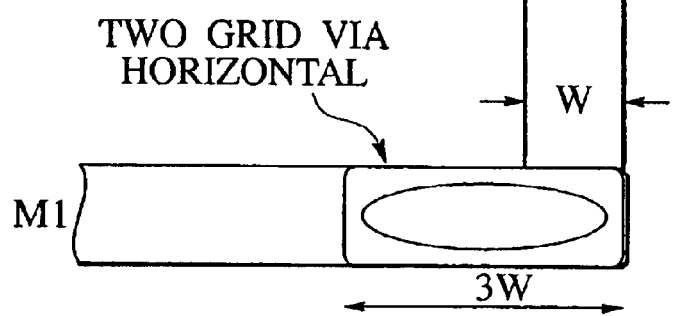

FIG. 5A to FIG. 5C are diagrams where the wiring layout of Case 1 in FIG. 4 has been exported. FIG. 5A shows a designed pattern. FIG. 5B shows a breakdown by layer of the designed pattern in FIG. 5A, wherein extending is performed to make the end portion of the second wiring pattern M2 into an L-shape. A horizontal VIA pattern with a length of 3 W is positioned at the overlapping portion of the first wiring pattern M1 and the second wiring pattern M2. The reason why the VIA pattern takes a horizontal shape is due to the fact that, as shown in FIG. 4, an existing wiring pattern extending in the horizontal direction exists in the vicinity of the wiring pattern of Case 1; however, this will be described later.

FIG. 5C is a planar view showing the pattern actually transferred upon an exposed wafer using a mask generated based on the wiring layout shown in FIG. 5A. In the VIA pattern shown in FIG. 5B, the inner rectangular-shape represents the cut portion and it is this portion that becomes the contact hole in the actual wiring circuit. Nevertheless, even if the designed pattern or the mask pattern based thereupon should be a rectangular shape, the pattern transferred upon the wafer during the lithography process experiences reduction and the corners are fully lost (shortening). With a conventional layout method, the contact hole is remarkably reduced through this shortening phenomena, and in the worst case, there is a danger of breakage in the contact hole. On the other hand, with the first embodiment, by using an L-shaped wiring pattern and a rectangular-shaped VIA pattern with a length of 3 W, as shown in FIG. 5C, an oval-shaped contact hole can be obtained having a sufficient amount of cross-sectional area secured even in the transferred pattern upon the wafer obtained after exposure.

Figure 7:
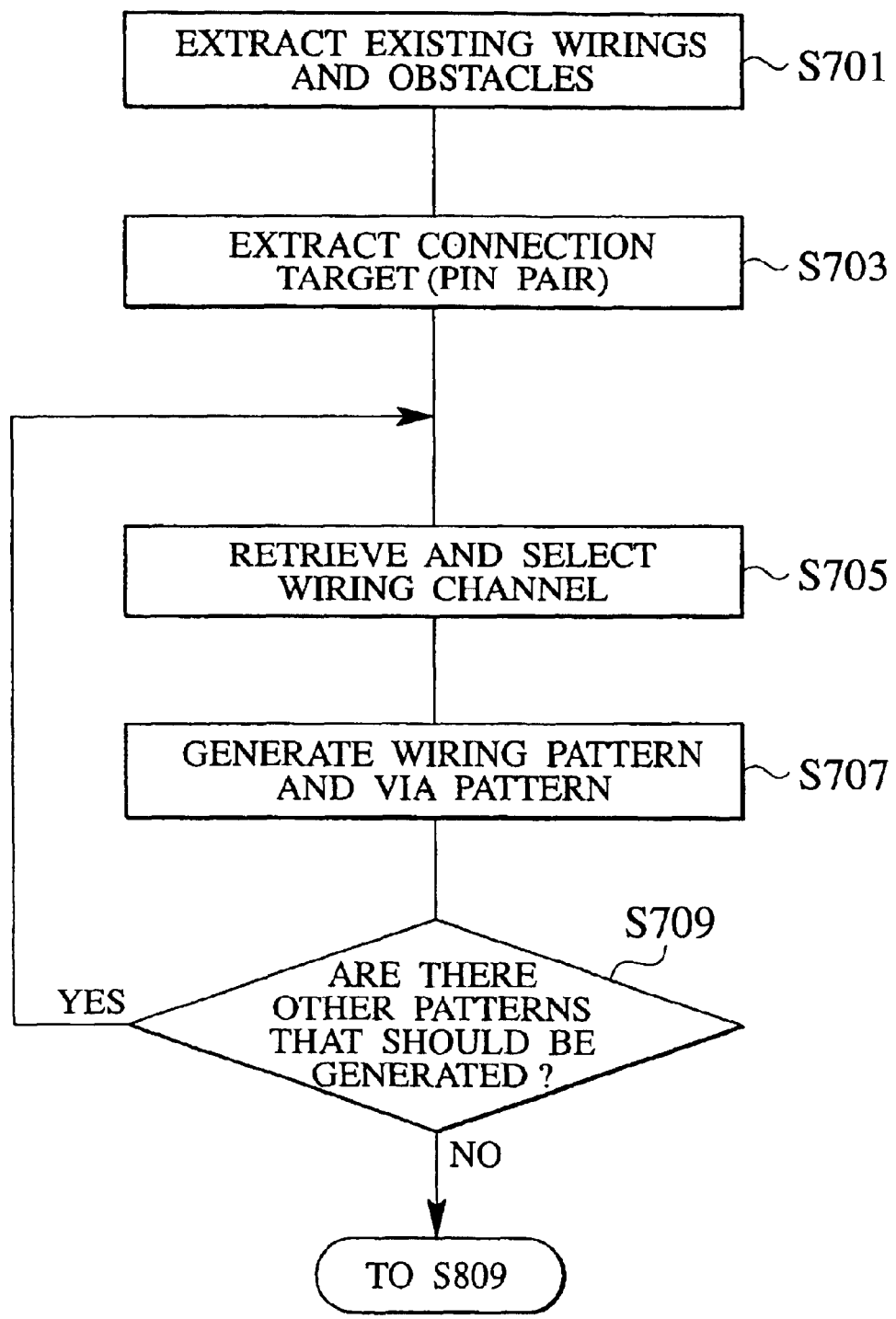
FIG. 7 is a flowchart showing the steps of positioning the power source lines and signal lines in the flowchart shown in FIG. 6.
Figure 8:
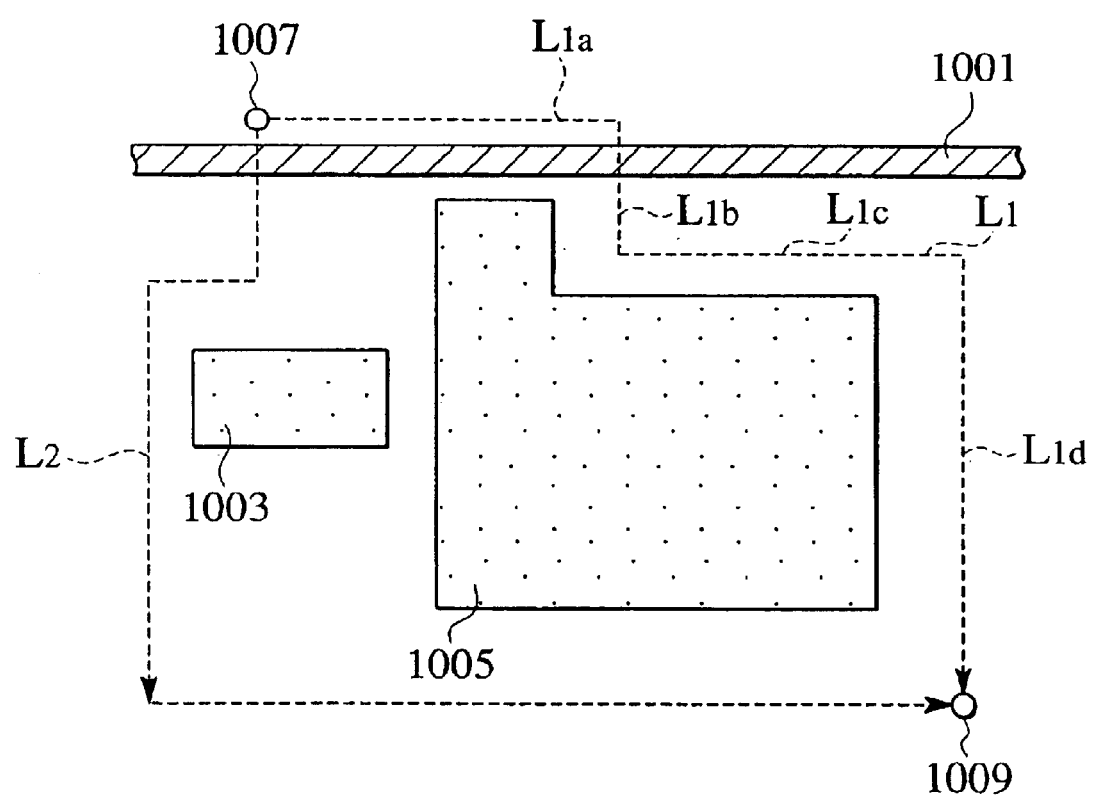
FIG. 8 is a diagram showing an example of circuit layout in a rectangular wiring system in order to provide supplementary description regarding the flowchart in FIG. 7.

Next, setting of a VIA pattern with due regard to the existence of an existing wiring pattern as with the Case 1 shown in FIG. 4 is described while referencing FIG. 6 to FIG. 8.

FIG. 6 is a flowchart of a wiring layout method for designing a semiconductor integrated circuit. To begin with, in Step S601, a floor plan is produced. More specifically, a single chip is divided into functionality blocks based on the required specifications thereof, and layout is determined giving due consideration to mutual disposition between blocks. Continuing, in Step S603, the size and position of logic cells is determined. These processes are performed using a net list comprising a logic circuit list of, for example, AND gates and inverters, and a library comprising information relating to wirings for each block. Once the positioning of the cells is determined, positioning of power source lines is set in Step S605, and positioning of the signal lines is set in Step S607. The layout method of a wiring pattern according to the first embodiment is also applicable to positioning of power source lines and positioning of signal lines.

Moreover, in Step S609, verification of the layout pattern is performed. Note that, a layout pattern means a compilation of graphic images upon a photomask, which is generated through an automated layout device and is to be used in the manufacture of a semiconductor integrated circuit. Such a layout pattern is checked for errors and in order to perform layout having an even higher percentage of completion, verification is always necessary. In Step S611, the verified layout data further undergoes OPC processing. OPC processing is a processing step where correction of data is conducted in advance in order to bring about a post-exposure wiring pattern, which is close to the designed pattern. The data upon which OPC is conducted is ultimately made the mask layout pattern.

FIG. 7 is a flowchart describing the positioning of the power source lines and signal lines (Steps S605 and S607) using the automated layout method of the first embodiment. To begin with, in Step S701, existing wirings and obstacles are extracted. As shown in FIG. 8, it is assumed that, for example, an existing wiring 1001 extending in the horizontal direction and obstacles 1003 and 1005 have already been positioned and set. In the case where a wiring pattern is made to overlap these, the obstacles, etc. are extracted beforehand, and the position and shape thereof is identified. In Step S703, the pair of pins to be connected are extracted. In the example of FIG. 8, a wiring is laid, for example, from start pin 1007 heading towards endpin 1009. In Step S705, wiring routes are retrieved. For example, two routes L1 and L2 avoiding existing wirings and obstacles are retrieved and of these, L1, which has a shorter wiring length is selected.

Next, in Step S707, the wiring pattern L1 (L1*a* to L1*b*) and the VIA pattern there corresponding are generated. In Step S709, it is determined whether another pattern to be generated. If there is none, processing is ended, and when at least one exists, processing returns to Step S705 and repeats Step 705 to Step S709.

Figure 9:
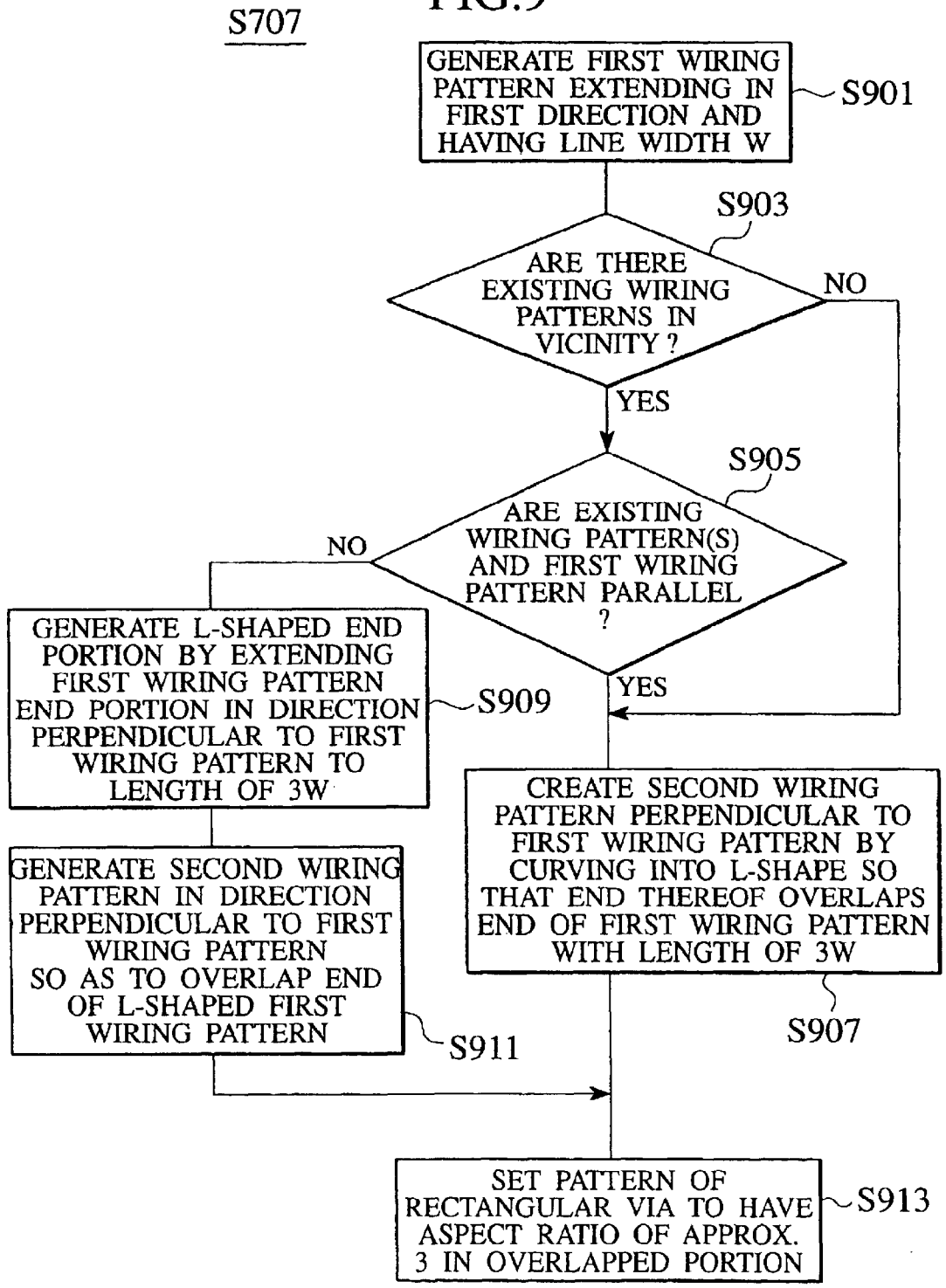
FIG. 9 is a flowchart showing the processing procedure details of the rectangular wiring pattern and VIA pattern generation step of the flowchart shown in FIG. 7.

FIG. 9 is a flowchart for describing the details of Step 707 in FIG. 7.

In Step S901, to begin with, a first wiring pattern (in the example of FIG. 8, L1*a*) with a line width of W extending in the horizontal direction is generated. In Step S903, determination of whether there is an existing wiring in the vicinity of this first wiring pattern is made. In the case where there is an existing wiring, in Step S905, it is determined whether the existing wiring is parallel to the first wiring pattern. In the case where it is parallel, processing proceeds to Step S907, and a second wiring pattern (L1*b* in FIG. 8) is generated extending in the direction perpendicular to the first wiring pattern. With an actual circuit, the second wiring pattern (L1*b*) is in a layer above first wiring pattern (L1*a*) and is connected through a contact hole. Therefore, the starting point of the second wiring pattern (L1*b*) is bent and extended into an L shape in the direction of L1*a* with a length of only 3 W, and is made to overlap the end portion of the first wiring pattern (L1*a*). In Step S913, a rectangular-shaped VIA pattern with an aspect ratio of approximately 3 is set in the L-shaped overlapping region.

In the case of FIG. 8, since there is an existing wiring pattern 1001 extending in the same direction in the same layer in the vicinity of the first wiring (L1*a*), it is impossible to have a rectangular shaped VIA in the vertical direction. This is because the lower layer wiring (or the end portion of L1*a*) is connected to an existing wiring 1001 through a VIA contact in the actual circuit. Therefore, the end of the second wiring pattern (L1*b*) is extended in a perpendicular direction in an upper layer of the first wiring pattern (L1*a*) and an overlapping region extending in a direction parallel with the existing wiring pattern is created. This prevents the existing wiring pattern (1001) from coming into contact with the first wiring pattern (L1*a*) and the second wiring pattern (L1*b*), even when actually connecting the VIA contact.

In Step S903, in the case where there is no existing wiring pattern in the vicinity of the first wiring pattern (when, for example, L1*c* is made the first wiring pattern), processing jumps to Step S907 and a second wiring pattern (for example L1*d*) having an L-shaped with a length of 3 W is generated.

In Step S905, in the case where the existing wiring is not parallel to the first wiring pattern, or more specifically, when there is an existing wiring in the vertical direction, processing proceeds to Step S909, and the end portion of the first wiring pattern is extended in an L-Shape with a length of only 3 W. In Step S911, a second wiring pattern is generated in a direction perpendicular to the first wiring pattern so as for the starting point thereof to overlap at the L-shaped region of the first wiring pattern. In Step S913, a rectangular-shaped VIA pattern with an aspect ratio of approximately 3 is set in the L-shaped overlapping region. If the second wiring pattern is made into an L-shape, since it would come into contact with an existing wiring, the end of the first wiring pattern is extended in an L-shape and used as a lower layer metal of a VIA contact.

In this manner, according to the automated layout method of the first embodiment, it is possible to determine the direction of a rectangular-shaped VIA with due regard to the existing wiring patterns drawn. In addition, since a rectangular-shaped VIA pattern having an aspect ratio of nearly 3 is generated as design data, even if OPC processing is not conducted on layout data, a VIA contact having sufficient area can be realized post-exposure. The above-described automated layout method is described as a program, which can be stored in various recording media, and allows operation of the automated layout device. The recording media may include not only the hard drive of an automated layout device, but also other well-known recording media such as external memory, magnetic diskette, optical disk, magneto-optical disk, and CD-ROM.

In regards to usage of vertical and horizontal VIAs, a plurality of types of libraries are registered, and it is possible to differentiate usage among the previously described methods in the wiring program. In addition, while the degrees of freedom of the wiring may be reduced, a rectangular-shaped VIA in either one of the directions that can easily secure a desired area may be defined beforehand in the library.

Figure 10:
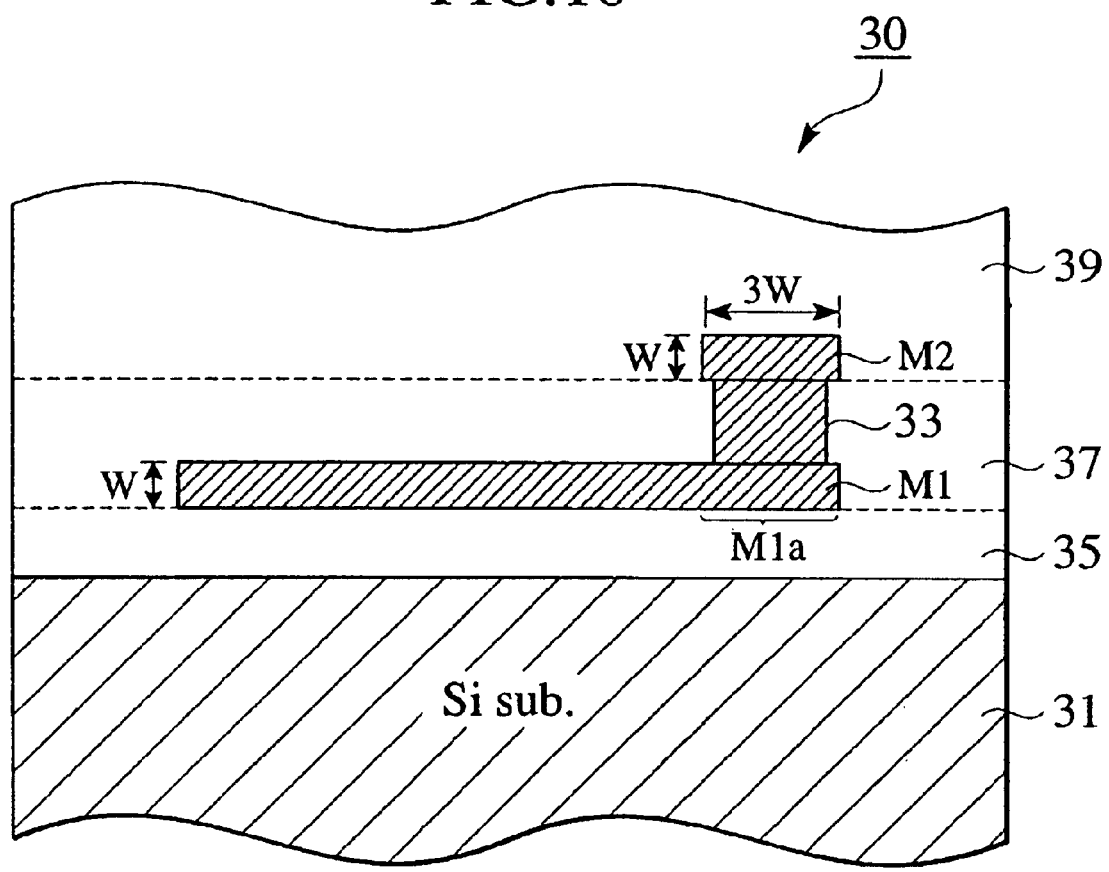
FIG. 10 is a cross-sectional view of a semiconductor integrated circuit of the present invention manufactured using a mask produced based on layout data generated in the method of FIG. 6.

FIG. 10 is a cross-sectional view of a semiconductor integrated circuit actually manufactured based on such a design layout method. Semiconductor integrated circuit 30 includes a substrate 31; a first interlayer insulating layer 35 upon the substrate 31; and a first metal wiring M1, which includes a first end region M1a extending in a direction horizontal to the surface of the paper upon the first interlayer insulating layer 35. A second interlayer insulating layer 37 is positioned covering the first metal wiring M1 and the first interlayer insulating layer 35. Upon the second interlayer insulating layer 37, a second metal wiring M2, which includes a region extending in a direction perpendicular to the first metal wiring M1 (the direction perpendicular to the surface of the paper) and bent into an L-shape overlapping the first end portion M1a of the first metal wiring M1 with a length of 3 W. Moreover, a third interlayer insulating layer 39 is provided. The region of the second metal wiring M2 bent into an L-shape and the first end region M1a of the first metal wiring M1 are connected by a VIA contact 33 passing through the second interlayer insulating layer 37. The cross-sectional shape of this VIA contact 33 is an oval having a minor axis somewhat smaller than W and the major axis somewhat shorter than 3 W.

The first end region M1a of the first metal wiring M1 functions as the bottom metal of the VIA contact 33, and the L-shaped region of the second metal wiring M2 functions as the top metal. The cross-sectional shape of the oval shape is completely included inside the bottom metal and the top metal. More specifically, a contact hole is completely covered as with a lid by the top metal and the bottom metal, and in later heat treatment processes as well, there is no worry of the tungsten (W), which fills the contact hole, melting and seeping out. In this manner, VIA resistance can be reduced while securing sufficient cross-sectional area after exposure, and in addition, an assured connection having no danger of breakage can be performed. Accordingly, performance of the semiconductor integrated circuit 30 and electromigration is improved.

It is noted that with the first embodiment described above, the aspect ratio of the VIA patterns made with CAD is made to be 3; however as long as it is above 2, more preferably between 3 and 5, VIA contact resistance can be sufficiently reduced without having unnecessarily long wiring extensions. In addition, the cross-section of a VIA contact of an actually obtained semiconductor device may become an oval shape corresponding to the aspect of this VIA, wherein the minor axis is somewhat shorter than W and the major axis is somewhat smaller than 2 W to 5 W.

<Second Embodiment>

Figure 2B:
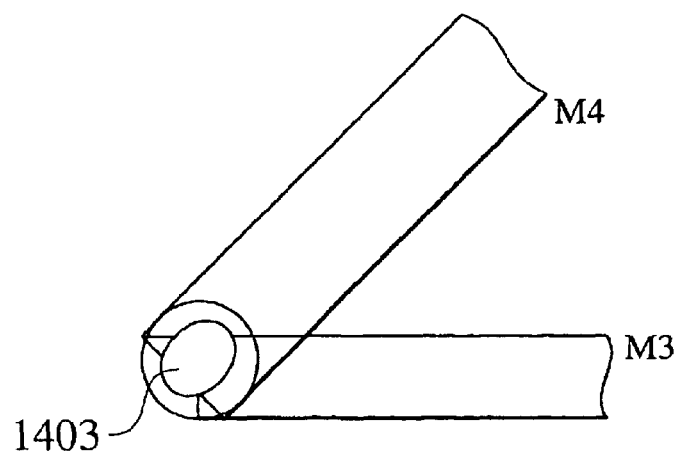
Figure 11B:
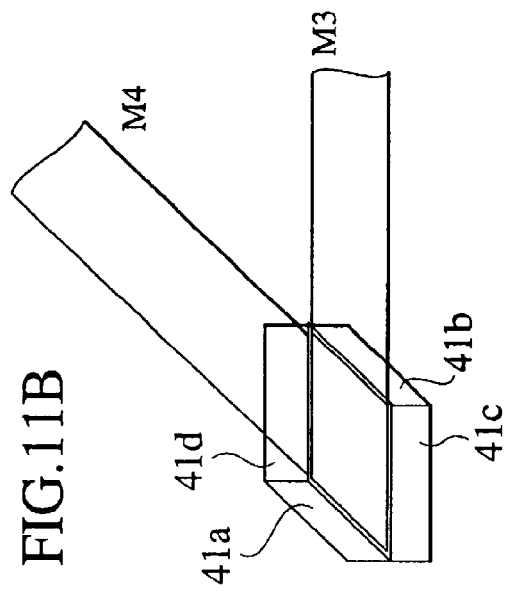
FIG. 11 is a diagram showing the procedure for optical correction processing on diagonal wirings and VIA patterns according to a second embodiment of the present invention.
Figure 11D:
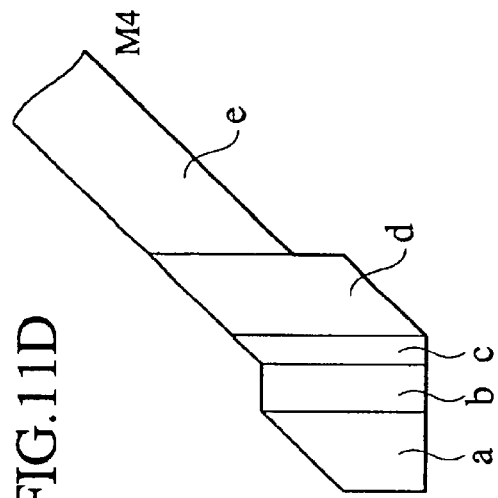
Figure 11A:
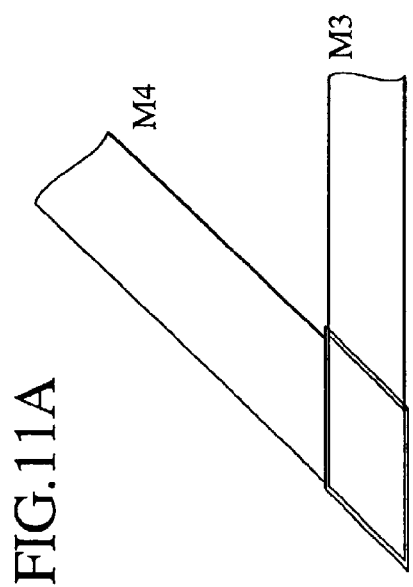

FIG. 11A to FIG. 11D are diagrams showing procedures for an optical correction method for a diagonal intersect wiring pattern according to a second embodiment of the present invention. With the example of FIG. 11A to FIG. 11D, OPC processing is conducted on diagonal wiring layout data for the ground wirings using a third or higher layer. To begin with, as shown in FIG. 11A, under CAD, a horizontally extending wiring pattern M3, which extends in the horizontal direction, and a diagonally extending wiring pattern M4 forming an angle of 45° therewith are formed, and a parallelogram-shaped VIA pattern is set in the region where the ends of these two wiring patterns M3 and M4 respectively overlap. At this point, the VIA pattern is set at the intersection of the centerline along the length of the wiring pattern M3 and the centerline along the length of the wiring pattern M4. If a mask were to be produced using the layout pattern data generated in this manner without modification, when this mask is used to transferred a pattern upon a wafer through exposure, as shown in FIG. 2B, VIA pattern shortening is severe especially on the two acute angle sides of the wirings M3 and M4, and there is a danger of breakage.

Figure 11C:
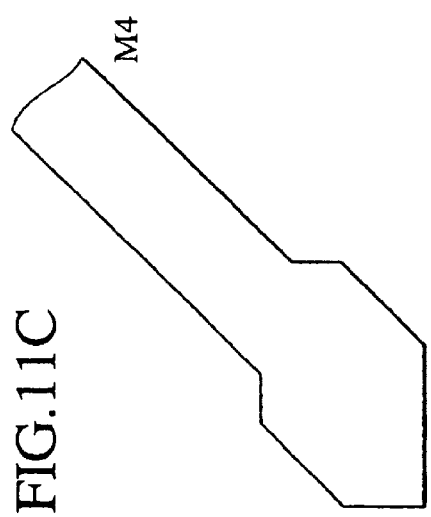

Therefore, OPC processing such as that shown in FIG. 11B is conducted. More specifically, surrounding the four edges of the parallelogram-shaped VIA pattern that has been laid out, expanded regions 41a through 41d are generated by moving each edge in a fixed direction (in the example of FIG. 11B, a direction orthogonal to wiring M3). Afterwards, as shown in FIG. 11C, the expanded regions 41a through 41d are merged with the diagonal wiring pattern M4. Moreover, as shown in FIG. 11D, the merged pattern is divided in the same direction (in the vertical direction) in which the expanded region was generated in FIG. 11B. According to this correction method, the merged pattern can be cleanly divided without any development of minutely divided regions. The mask data for the VIA pattern portion corresponds to divided regions a through d. In comparison with the mask data for the VIA with the five divided regions a through e shown in FIG. 3D, the amount of data, according to the second embodiment, is reduced approximately 20%. In addition, while minutely divided region e develops with the conventional example shown in FIG. 3D, according to the second embodiment, such a minutely divided region does not develop and therefore exposure accuracy may be improved without using an exposure light source with short wavelengths.

In the example of FIGS. 11A to 11D, a fixed direction orthogonal to wiring pattern M3 is used, however, it is also possible to make this a horizontal direction for wiring pattern M3. In such a case, the expanded region 41c and 41d outside the two edges along the horizontal wiring pattern M3 are as shown in FIG. 11B; however, the expanded regions 41a and 41b outside the two edges along the diagonal wiring pattern M4 project out in the horizontal direction. In the case of dividing the post-merge pattern, division is made along the horizontal direction. In this case, the number of regions is further reduced, and the amount of mask pattern data is also greatly reduced.

<Third Embodiment>

Figure 12A:
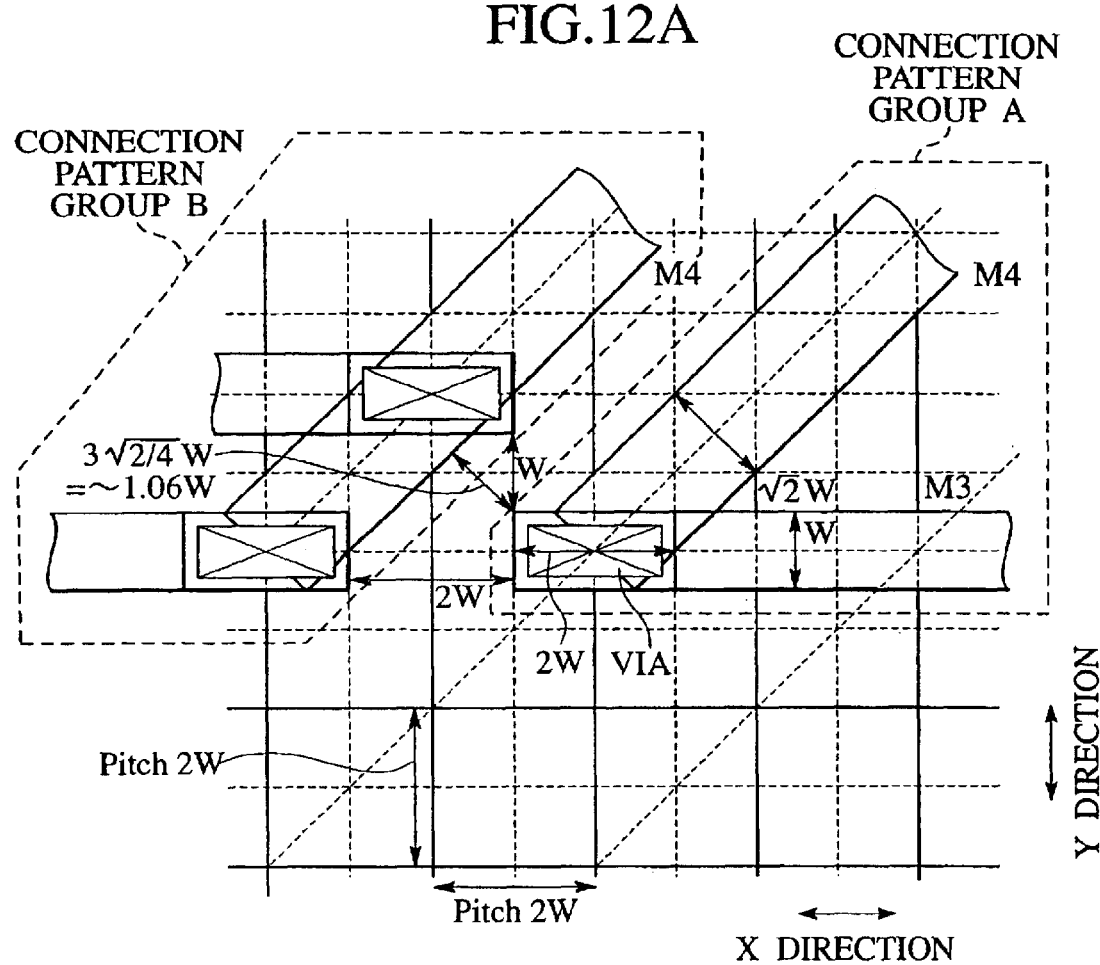
FIG. 12A and FIG. 12B are diagrams showing a diagonal wiring layout design pattern generated through the automated layout method and the pattern transferred upon a wafer, according to a third embodiment of the present invention.

FIG. 12A is a diagram showing an automated layout method for diagonal wirings according to a third embodiment of the present invention. With the third embodiment, wiring layout of signal lines formed on the higher layers than the memory cell formation layer is addressed. A characteristic of the third embodiment is that, for example, a rectangular-shaped VIA having an aspect ratio of approximately 2 or higher, for example, 2 is set on the overlapping region for connecting the first wiring pattern and the second wiring pattern extending diagonally thereto. Moreover, optical correction processing is conducted on such rectangular-shaped VIAs and a VIA contact having sufficient cross-sectional area in the post-exposure transferred pattern upon a wafer is achieved.

More specifically, a first wiring pattern M3 with a line width W and extending in the horizontal direction (x direction) of FIG. 12A is generated, and a second wiring pattern M4 extending in a diagonal direction forming a 40° angle with the first wiring pattern M3 is also generated so that the end thereof can overlap the end of first wiring pattern M3. The line width of the second wiring pattern M4 extending diagonally is made wider than that of the first wiring pattern M3. For example,√(2 W) or greater is preferred. Because, since the second wiring pattern M4 is formed in a higher layer than the memory cell formation layer, miniaturization of the design rules is not required to the extent of the memory cell formation layer. Furthermore, because the wiring length is shortened by having the wirings run diagonal, and the wiring width is widened so that the wiring resistance can be greatly reduced.

Next, a rectangular-shaped VIA pattern having an aspect ratio of 2 or higher, for example, 2 is formed along the first wiring pattern M3 at the intersection of the centerline along the length of the first wiring pattern M3 and the centerline along the length of the second wiring pattern M4. In other words, a rectangular-shaped VIA pattern having a length of 2 W is generated along the first wiring pattern M3. The first (horizontal) wiring pattern, the second (diagonal) wiring pattern, and the VIA pattern formed in this manner is called a connection pattern group. Another connection pattern group similarly comprising a horizontal wiring pattern, diagonal wiring pattern, and a VIA pattern there connecting can be generated in the vicinity of the connection pattern group formed in this manner.

For example, as shown in FIG. 12A, in the case of generating the left-hand-side connection pattern group B in the vicinity of the right-hand-side connection pattern group A, a third wiring pattern M3 extending horizontally (in the x direction) is generated, a fourth wiring pattern M4 extending diagonally to form a 45° angle with this third wiring pattern is generated, and a rectangular-shaped VIA pattern having an aspect ratio of 2 or higher, for example, 2 is set at the intersection of the centerlines along the lengths of this M3 and M4, respectively. Here, the interval of the first wiring pattern and the third wiring pattern extending in the horizontal direction takes up a distance of at least 2 W. In addition, the interval of the VIA pattern of the connection pattern group A and the closest VIA pattern included in the connection pattern group B is made to be at least W. Through such layout, there is no chance of the track of the diagonal wiring in the connection pattern group which has a neighboring VIA pattern, and further, there is no chance of it coming into contact with the nearest VIA pattern. It is noted that with the example of FIG. 12A, the distance from the VIA pattern of the right-hand-side connection pattern group A to the diagonal wiring of the right-hand-side connection pattern group A, is at least $3\sqrt{\ }(2 W/4)$ (approximately 1.06 W).

Figure 13A:
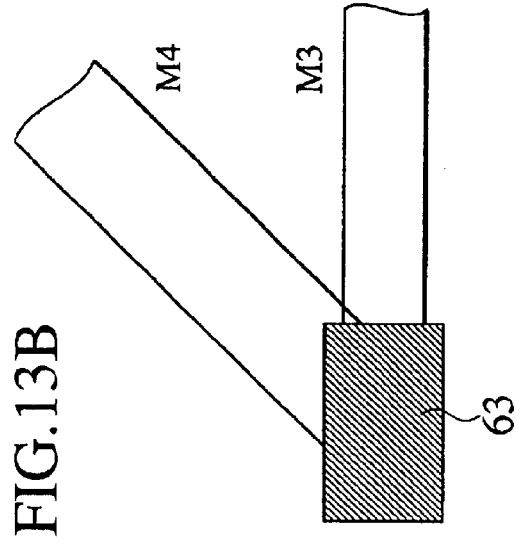
FIG. 13A to FIG. 13D are diagrams showing the procedure for optical correction processing conducted on a layout pattern generated through the automated layout method of FIG. 12A.
Figure 13B:
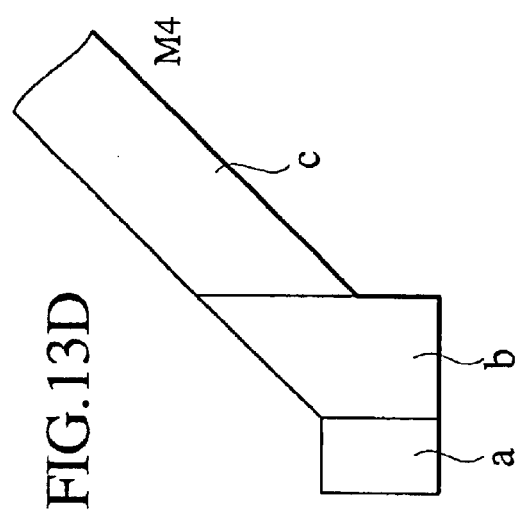
Figure 13C:
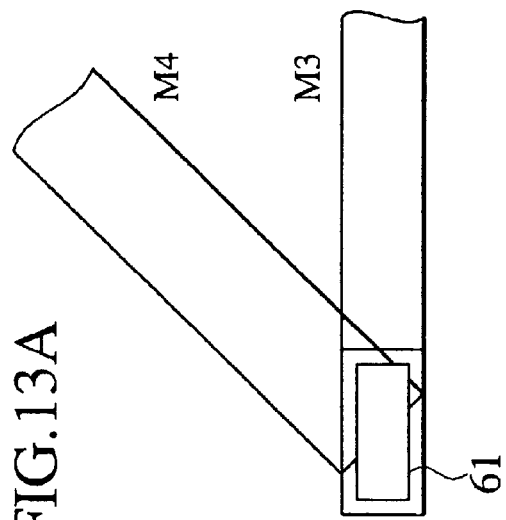
Figure 13D:
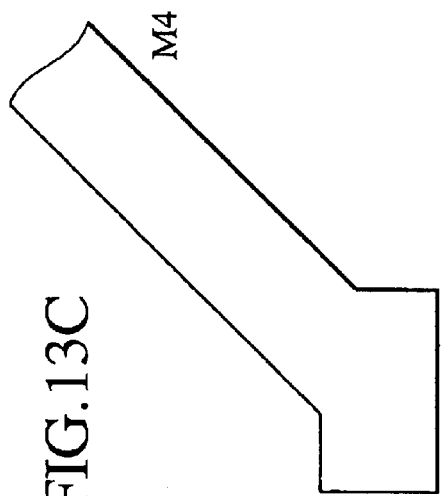

FIG. 13A to FIG. 13D show a procedure for conducting OPC processing on layout data of the wiring patterns generated by the method shown in above-described FIG. 12A. FIG. 13A is exported from the right-hand-side connection pattern group A in FIG. 12A. A rectangular-shaped VIA pattern 61 is set at the intersection of the first wiring pattern M3 which extends in the horizontal direction (x direction) and the diagonal second wiring pattern M4. The center point of the rectangular-shaped VIA pattern is aligned with the intersecting point of the two wiring patterns. Next, as shown in FIG. 13B, the region of the rectangular-shaped VIA pattern 61 is expanded a predetermined rate without changing the center point thereof so as to generate an OPC expanded region 63. As shown in FIG. 13C, the expanded region 63 and the second wiring pattern M4 are merged. As shown in FIG. 13D, the merged pattern is divided in a predetermined direction (for example in the vertical direction (y axis direction)). According to the optical correction method of the third embodiment, the ultimately divided region (data block) of the mask pattern for the diagonal wiring has only three regions, region a through region c, and of those, the portions corresponding to the VIA connect is complete with only two regions. More specifically, in comparison with the optical correction method shown in FIG. 2, the amount of data can be further reduced by 50%.

Figure 12B:
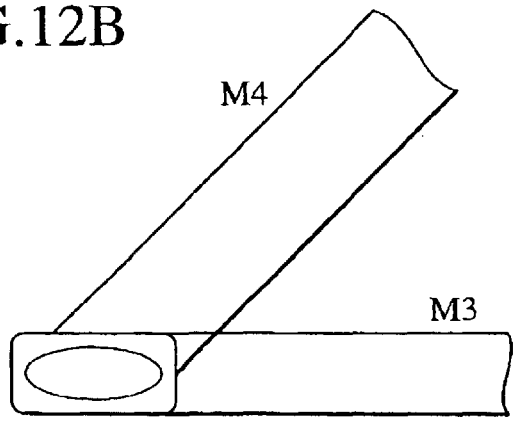

FIG. 12B shows the pattern transferred upon a wafer using a mask generated based on the wiring layout method shown in FIG. 11A to FIG. 11D, and the optical correction processing shown in FIG. 13A to FIG. 13D there continuing. Since the rectangular-shaped VIA region and the diagonal wiring pattern M4 covering the same is expanded on a data basis, it is possible to compensate for exposure-caused shortening, and form an oval shaped VIA contact hole having sufficient cross-sectional area. In addition, since the respective ends of the horizontal wiring pattern M3 and the diagonal wiring pattern M4 are made the bottom and top metals and sufficiently cover the VIA contact hole, it is possible to prevent breakage by filling the contact hole with, for example, tungsten (W), thereafter perform heat treatment without the danger of fusing the tungsten. In addition, since the VIA contact has sufficient cross-sectional area, it is possible to reduce VIA resistance.

Figure 14:
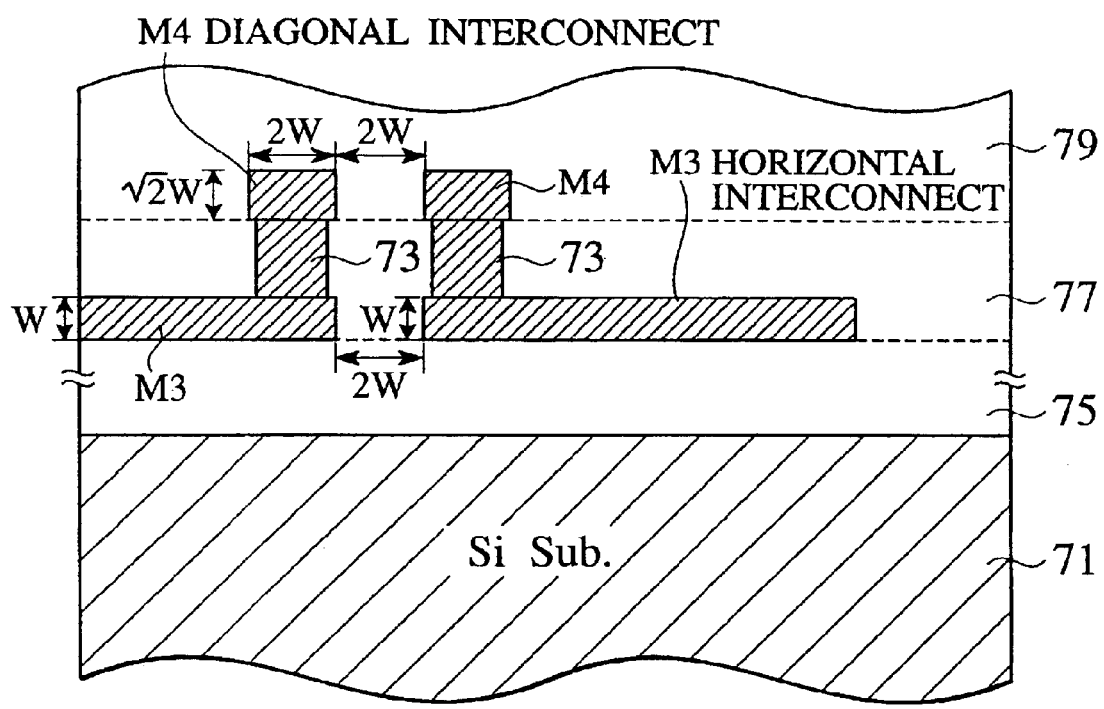
FIG. 14 is a cross-sectional view of a semiconductor integrated circuit actually manufactured based on the mask data of diagonal wirings generated through the automated layout method of FIG. 12A and the optical correction processing of FIG. 13A through FIG. 13D.

FIG. 14 is a cross-sectional view of a semiconductor integrated circuit manufactured using a mask produced based on the method of the above-mentioned third embodiment.

Semiconductor integrated circuit 70 includes a semiconductor substrate 71; a first metal wiring M3, which has a width of W and extends horizontally on a first interlayer insulating layer 75 and above semiconductor substrate. Further, the semiconductor integrated circuit 70 includes: a second metal wiring M4, which extends in a diagonal direction on a second interlayer insulating layer 77 and above the first metal wiring M3; and a VIA contact 73, which passes through the second interlayer insulating layer 77 and connects the end region of the first metal wiring M3 and the end region of the second metal wiring M4. With the third embodiment, the diagonal second metal wiring M4 and the first metal wiring M3 form a 45° angle. The end region of the first metal wiring M3 is a rectangular-shaped expanded region, which extends from the end of the horizontally extending second metal wiring M4 toward the first metal wiring M3 and has an aspect ratio of at least 2. This expanded region functions as the top metal of the VIA contact 73.

The cross-sectional shape of the VIA contact 73 is an oval having a minor axis somewhat smaller than W and the major axis somewhat smaller than 2 W. The cross-sectional shape of this oval falls completely within the end portion of the first metal wiring M3 and the rectangular-shaped expanded region of the second metal wiring M4.

Semiconductor integrated circuit 70 further includes: a third metal wiring M3, which extends horizontally and has a width of W; a fourth metal wiring M4, which extends diagonally and is disposed on the second interlayer insulating layer 77 and above the third metal wiring M3; and a VIA contact 73, which passes through the second interlayer insulating layer 77 and connects the end portion of the fourth metal wiring M4 and the end portion of the third metal wiring M3. The interval between the horizontally extending first metal wiring M3 and the third metal wiring M3 and the interval between a VIA contact and a neighboring VIA contact maintains a distance of at least 2 W. Through such a wiring structure, contact among contact holes and contact among wirings is avoided.

FIG. 15 is a flow chart that shows the procedure of the wiring layout and the optical correction processing described above. To begin with, in Step S1501, a first wiring pattern with line width W and extending in a first direction is generated. The first direction may be the horizontal direction (x direction) or the vertical direction (y direction). Next, in Step S1503, a second wiring pattern extending diagonally to form a predetermined angle with the first wiring pattern is generated so that the end portion thereof overlaps the end portion of the first wiring pattern. In Step S1505, the intersecting point of the center line along the length of the first wiring pattern and the center line along the length of the second wiring pattern is detected and a rectangular-shaped VIA pattern having length 2 W is generated along the first wiring pattern with this intersecting point made the center point. In Step S1507, the rectangular shaped VIA pattern is expanded with the center point as the reference, generating, for example, a rectangular shaped expanded pattern having an aspect ratio of at least 2, for example 2 and the expanded pattern is merged with the second wiring pattern. In Step S1509, the merged pattern is divided into a plurality of regions in a predetermined direction. The predetermined direction may be, for example, the vertical direction or horizontal direction. In Step S1511, the data of the pattern generated in such a manner is saved as layout data for producing a mask.

A program, which causes an automated layout device and/or an optical correction device to automatically perform the processing described above, may be stored in advance in any appropriate recording media.

Here, "recording media" refers to any suitable media capable of recording a program such as an external memory device for a computer, semiconductor memory, magnetic disk, optical disk, magneto-optical disk, or magnetic tape. More specifically, this includes "recording media" such as a floppy disk, CD-ROM, MO disk, cassette tape, or open reel tape. Through the use of the program described above, which is stored in recording media, an automated layout device or optical correction device is able to produce mask drawing pattern data for generating precise wiring patterns with a smaller amount of data.

The present invention has been described in terms of preferred embodiments; however the present invention is not limited to what is described in these embodiments. Various modifications and improvements will become clear to persons with ordinary skill in the art.

As described above, according to the wiring pattern automated layout method of the present invention, in the case of wiring layout based on the rectangular coordinate system, it is possible to generate a post-exposure VIA contact having sufficient cross-sectional area with simplified processing.

Furthermore, in the case of diagonal wiring layout, it is possible to achieve a VIA contact having sufficient cross-sectional area while greatly reducing the amount of mask pattern data.

According to the optical correction processing of the present invention, it is possible to divide a generated layout pattern into an even smaller number of regions having defined shapes through simplified processing, and it is also possible to reduce the amount of data while using an existing exposure light source to improve exposure accuracy.

A semiconductor device integrated circuit manufactured using a mask produced based on such a layout method and optical correction method can achieve a VIA wherein a VIA contact is surely covered by a top metal and a bottom metal and has sufficient cross-sectional area. This allows a circuit having reduced VIA resistance, and superior LSI performance and electromigration resistance to be achieved.

What is claimed is:

1. A wiring pattern layout method, comprising:
generating a first wiring pattern with width W extending in a first direction;
generating a second wiring pattern with width W extending in a direction perpendicular to the first wiring pattern in a manner such that the end portion thereof ends at the end portion of the first wiring pattern;
generating an overlapping region by bending an end portion of either one of the first or the second wiring pattern at a right angle to produce an L-shaped extension and overlaying the first and the second wiring pattern; and
generating a rectangular-shaped VIA pattern at the overlapping region.

2. The wiring pattern layout method according to claim 1, wherein
the L-shaped extension has an extension with a length of at least 2 W but no greater than 5 W; and
the rectangular-shaped VIA pattern has an aspect ratio of at least two but no greater than five.

3. The wiring pattern layout method according to claim 1, further comprising:
determining whether an existing wiring pattern has already been positioned in the vicinity of the first wiring pattern after the first wiring pattern generation; and
generating in the case where the existing wiring pattern exists and the wiring pattern of the existing wiring pattern is parallel with the first wiring pattern, an L-shaped extension, which overlaps the end portion of the first wiring pattern, by bending the end portion of the second wiring pattern at a right angle and expanding.

4. The wiring pattern layout method according to claim 1, further comprising:
determining whether an existing wiring pattern has already been positioned in the vicinity of the first wiring pattern alter the first wiring pattern generation; and
generating in the case where the existing wiring pattern exists and the wiring pattern of the existing wiring pattern is not parallel with the first wiring pattern, an L-shaped extension, which overlaps the end portion of the second wiring, by bending the end portion of the first wiring pattern at a right angle and expanding.

5. A semiconductor device, comprising:
a substrate;
a first interlayer insulating layer on the substrate;
a first metal wiring on the first interlayer insulating layer, the first metal wiring having a width of W; extending in a first direction and having a first end portion;
a second interlayer insulating layer covering the first metal layer and the first interlayer insulating layer;
a second metal wiring on the second interlayer insulating layer, the second metal wiring extending in a direction perpendicular to the first metal wiring, and having an L-shaped bent region with a length of at least 2 W but no greater than 5 W overlapping the first metal wiring end; and
a VIA contact passing through the second interlayer insulating layer, the VIA contact connecting the first metal wiring end and the L-shaped bent region of the second metal wiring.

6. The semiconductor device according to claim 5, wherein:

cross-sectional shape of the VIA contact is an oval shape where minor axis is W and major axis is ax least 2 W but no greater than 5 W; and falls inside the end portion of the first metal mid the L-shaped bent region of the second metal wiring, respectively.

7. A computer readable recording medium, which is recorded with a program for causing an automated layout device to operate, the program comprising:

generating a first wiring pattern with width W extending in a first direction;

generating a second wiring pattern with width W extending in a direction perpendicular to the first wiring pattern in a manner such that the end portion thereof ends at the end portion of the first wiring pattern;

generating an overlapping region by bending an end portion of either one of the first or the second wiring pattern at a right angle) extending to a length of at least 2 W but no greater than 5 W, and overlaying the first wiring pattern and the second wiring pattern; and generating at the overlapping region a rectangular-shaped VIA pattern having an aspect ratio of at least two but no greater than five.

* * * * *